(12) United States Patent
Keith

(10) Patent No.: US 7,863,909 B2
(45) Date of Patent: Jan. 4, 2011

(54) SYSTEM AND METHOD FOR MEASURING A CAPACITANCE BY TRANSFERRING CHARGE FROM A FIXED SOURCE

(75) Inventor: Colby Keith, Santa Clara, CA (US)

(73) Assignee: Synaptics Incorporated, Santa Clara, CA (US)

( * ) Notice: Subject to any disclaimer, the term of this patent is extended or adjusted under 35 U.S.C. 154(b) by 485 days.

(21) Appl. No.: 12/042,217

(22) Filed: Mar. 4, 2008

(65) Prior Publication Data

US 2009/0224776 A1    Sep. 10, 2009

(51) Int. Cl.
    *G01R 27/26* (2006.01)
(52) U.S. Cl. ....................... 324/678; 324/663
(58) Field of Classification Search ................. 324/662, 324/663, 678
    See application file for complete search history.

(56) References Cited

U.S. PATENT DOCUMENTS

| | | | |
|---|---|---|---|
| 6,366,099 B1 * | 4/2002 | Reddi | ........................ 324/678 |
| 6,466,036 B1 | 10/2002 | Philipp | |
| 6,486,680 B1 * | 11/2002 | Mull | ........................ 324/662 |
| 6,639,414 B2 | 10/2003 | Lien | |
| 6,956,515 B2 | 10/2005 | Keehr et al. | |
| 7,129,714 B2 | 10/2006 | Baxter | |
| 2003/0113783 A1 * | 6/2003 | Funaki et al. | ................... 435/6 |
| 2004/0004488 A1 | 1/2004 | Baxter | |
| 2010/0181180 A1 * | 7/2010 | Peter | ........................ 200/5 R |

OTHER PUBLICATIONS

Fiorenza, John K., "Comparator-Based Switched-Capacitor Circuits for Scaled CMOS Technologies," IEEE Journal of Solid-State Circuits, vol. 41, No. 12, Dec. 2006, pp. 2658-2668.

* cited by examiner

*Primary Examiner*—Jeff Natalini
(74) *Attorney, Agent, or Firm*—Ingrassia, Fisher & Lorenz, P.C.

(57) ABSTRACT

A touch sensor device and method is provided that determines measurable capacitances for object detection. The systems and methods measure capacitance by controllably transferring charge from a storage capacitor, and determining the measurable capacitance by measuring the residual voltage remaining on the storage capacitor after the transfer. The systems and methods thus provide an accurate determination of the measurable capacitance that can be used for object proximity sensing.

22 Claims, 9 Drawing Sheets

SYSTEM AND METHOD FOR MEASURING A CAPACITANCE BY TRANSFERRING CHARGE FROM A FIXED SOURCE

FIELD OF THE INVENTION

This invention generally relates to electronic devices, and more specifically relates to proximity sensor devices and using a capacitive proximity sensor device for producing user interface inputs.

BACKGROUND OF THE INVENTION

Proximity sensor devices (also commonly called touch pads or touch sensor devices) are widely used in a variety of electronic systems. One type of proximity sensor is a capacitive proximity sensor device. A capacitive proximity sensor device typically includes a sensing region, often demarked by a surface, and uses capacitive technology to determine the presence, location and/or motion of one or more fingers, styli, and/or other objects. The capacitive proximity sensor device, together with finger(s) and/or other object(s), can be used to provide an input to the electronic system. For example, proximity sensor devices are used as input devices for larger computing systems, such as those found integral within notebook computers or peripheral to desktop computers. Capacitive proximity sensor devices are also used in smaller systems, including: handheld systems such as personal digital assistants (PDAs), remote controls, communication systems such as wireless telephones and text messaging systems. Increasingly, proximity sensor devices are used in media systems, such as CD, DVD, MP3, video or other media recorders or players.

A user generally operates a capacitive proximity sensor device by placing or moving one or more fingers, styli, and/or objects, near a sensing region of one or more sensors located on or in the sensor device. This creates a capacitive effect upon a carrier signal applied to the sensing region that can be detected and correlated to positional information (such as the position(s) or proximity or motion or presences or similar information) of the stimulus/stimuli with respect to the sensing region. This positional information can in turn be used to select, move, scroll, or manipulate any combination of text, graphics, cursors and highlighters, and/or any other indicator on a display screen. This positional information can also be used to enable the user to interact with an interface, such as to control volume, to adjust brightness, or to achieve any other purpose.

Although capacitance proximity sensor devices have been widely adopted for several years, sensor designers continue to look for ways to improve the sensors' functionality and effectiveness. In particular, designers continually strive to improve the accuracy and performance of the sensor device. Furthermore, designers continually strive to simplify the design and implementation of position sensor devices without increasing costs. Moreover, as sensor devices become increasingly in demand in various types of electronic devices, a need for a highly-flexible yet low cost and easy to implement sensor design arises. In particular, a continuing need exists for a sensor design scheme that is flexible enough for a variety of implementations and powerful enough to provide accurate capacitance sensing while remaining cost effective.

Accordingly, it is desirable to provide systems and methods for quickly, effectively and efficiently detecting a measurable capacitance. Other desirable features and characteristics will become apparent from the subsequent detailed description and the appended claims, taken in conjunction with the accompanying drawings and the foregoing technical field and background.

BRIEF SUMMARY OF THE INVENTION

The embodiments of the present invention provide systems and methods for determining measurable capacitances that are applicable to proximity sensor devices. The systems and methods measure capacitance by controllably transferring charge from a storage capacitor, and determining the measurable capacitance by measuring the residual voltage remaining on the storage capacitor after the transfer. The systems and methods thus provide an accurate determination of the measurable capacitance that can be used for object proximity sensing.

In a first embodiment, a capacitive proximity sensor device is provided that includes a sensing electrode, a storage capacitor, a charging circuit, a charge transfer circuit and a measurement circuit. The sensing electrode has an associated measurable capacitance that varies with object proximity to the electrode. The charging circuit is configured to selectively charge storage capacitor to a predetermined level and thereby store a set amount of charge on the storage capacitor. The charge transfer circuit is configured to controllably transfer charge from the storage capacitor to the sensing electrode while measuring voltage on the sensing electrode. The charge transfer circuit ceases controllably transferring charge responsive to the measured voltage on the sensing electrode reaching a defined level. This leaves a residual voltage remaining on the storage capacitor after the transfer. The measurement circuit is coupled to the storage capacitor and configured to measure the residual voltage remaining on the storage capacitor. The measurement of the residual voltage is then used to determine the measurable capacitance associated with the sensing electrode from the measured residual voltage.

In a second embodiment, a method for sensing a proximate object is provided. The method comprises the steps of charging a storage capacitor to a predetermined level; controllably transferring charge from the storage capacitor to a sensing electrode while measuring voltage on the sensing electrode, until the measured voltage on the sensing electrode reaches a defined level, with a residual voltage remaining on the storage capacitor after the transferring; measuring the residual voltage remaining on the storage capacitor; and determining the measurable capacitance associated with the sensing electrode from the measured residual voltage.

BRIEF DESCRIPTION OF DRAWINGS

The preferred exemplary embodiment of the present invention will hereinafter be described in conjunction with the appended drawings, where like designations denote like elements, and.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The embodiments of the present invention provide systems and methods for determining measurable capacitances that are applicable to proximity sensor devices. The systems and methods measure capacitance by controllably transferring charge from a storage capacitor, and determining the measurable capacitance by measuring the residual voltage remaining on the storage capacitor after the transfer. Because the system and method measures at the storage capacitor and not the sensing electrode, it provides for the use of simplified measurement techniques and good noise rejection. The systems and methods thus can provide an accurate determination of the measurable capacitance that can be used for object proximity sensing.

Figure 1:
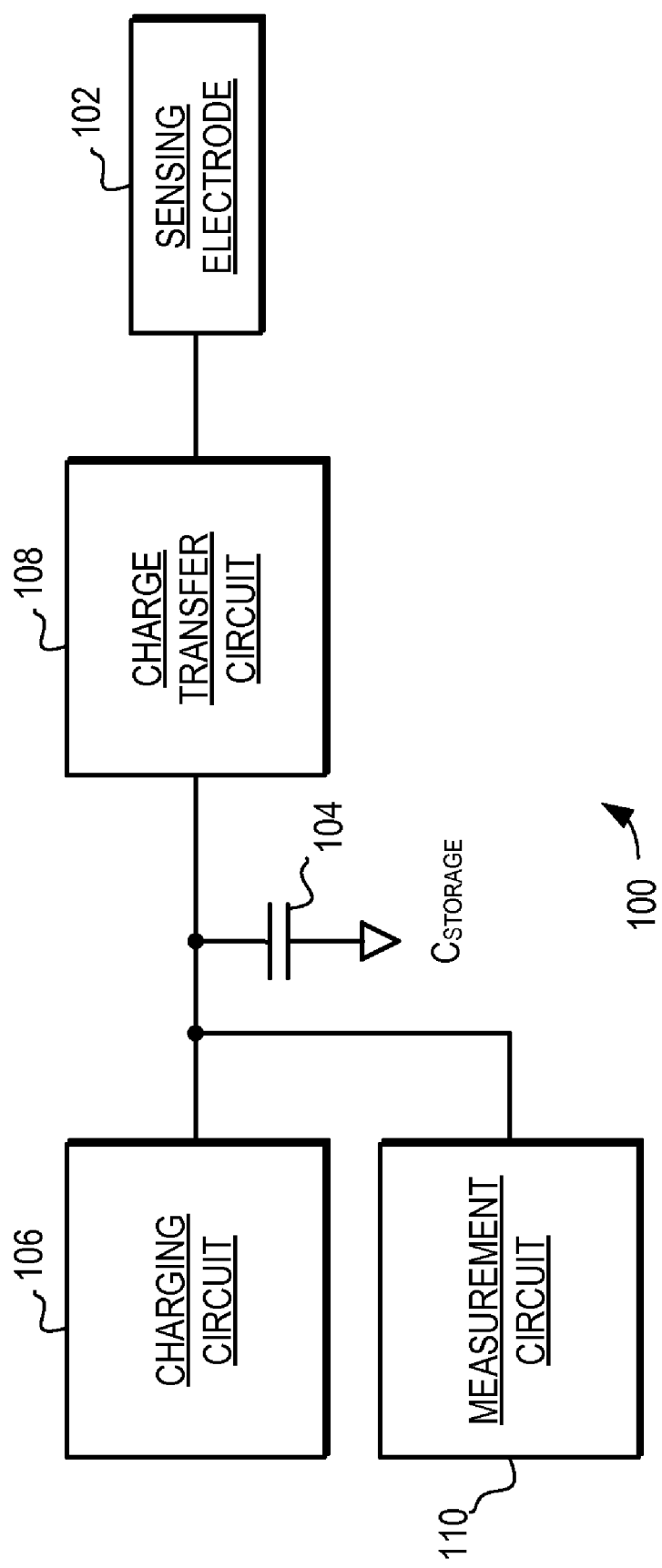
FIG. 1 is a schematic drawing of a capacitive measuring device in accordance with an embodiment of the invention.

Turning now to FIG. 1, a capacitive measuring device 100 is illustrated schematically. In general, the capacitance measuring device 100 provides the ability to determine the measurable capacitance associated with a sensing electrode, such as the capacitance between the sensing electrode and a proximate conductive object, and can thus be used in capacitive proximity sensor devices. The capacitive measuring device 100 includes a sensing electrode 102, a storage capacitor 104, a charging circuit 106, a charge transfer circuit 108 and a measurement circuit 110. The sensing electrode 102 has an associated measurable capacitance that varies with object proximity to the electrode. The charging circuit 106 is configured to selectively charge the storage capacitor 104 to a predetermined level and thereby store a set amount of charge on the storage capacitor 104. The charge transfer circuit 108 is configured to controllably transfer charge from the storage capacitor 104 to the sensing electrode 102 while measuring voltage on the sensing electrode 102. The charge transfer circuit ceases controllably transferring charge responsive to the measured voltage on the sensing electrode 102 reaching a defined level. This leaves a residual voltage remaining on the storage capacitor 104 after the transfer. The measurement circuit 110 is coupled to the storage capacitor and configured to measure the residual voltage remaining on the storage capacitor 104. The measurement of the residual voltage is then used to determine the measurable capacitance associated with the sensing electrode 102.

In general, the sensing electrode 102 is a conductive electrode that provides a measurable capacitance that varies with the proximity of conductive objects to the electrode. In most sensing applications a set of sensing electrodes 102 is formed together and used to detect object positional information through multiple measurements of capacitance for each electrode. The sensing electrodes 102 can be implemented with a variety of different conductive materials and structures. For example, a set of sensing electrodes 102 can be formed on substrate using conductive ink deposition and patterning. The shape and arrangement of the sensing electrodes 102 will generally depend on the specific application the sensor device 100 is being implemented in. Furthermore, the electrodes 102 can be implemented to provide a measurable capacitance that is measured between the electrode 102 and a local ground, generally referred to as an "absolute capacitance". Alternatively, the electrodes 102 can be implemented to provide a measurable capacitance that is measured between a driving electrode and a sensing electrode (while be affected by proximate objects), generally referred to as a "transcapacitance". In either case, charge is transferred to the sensing electrode 102 from the storage electrode 104 and the remaining charge on the storage capacitor 104 is used determine the measurable capacitance associated with the sensing electrode 102 and any proximate conductive objects.

In general, the charging circuit 106 is configured to selectively charge the storage capacitor 104 to a predetermined level and thereby store a set amount of charge on the storage capacitor 104. The storage capacitor 104 is selected to be large enough that sufficient charge can be stored for transferring to the sensing electrode. Typically, a storage capacitor 104 having at least twice the capacitance of the sensing electrode measurable capacitance will be sufficient.

In one example, the charging circuit 106 comprises a switch that selectively connects and disconnects the storage capacitor 104 to a set voltage. The storage capacitor 104 is charged to the predetermined level by closing the switch. The switch is then opened, disconnecting the storage capacitor 104 from the charging circuit 106 and leaving the storage capacitor 104 with a set amount of charge. When so charged and disconnected the storage capacitor 104 stores a limited discrete amount of charge, a portion of which can then be transferred to the sensing electrode 102. It is important to note that because the storage capacitor 104 is disconnected from the charging circuit 104 before the transfer to sensing electrode 102, the amount of charge transferred to the sensing electrode 102 is reflected in the amount of charge that remains after the transfer on the storage capacitor 104. In contrast, previous techniques for capacitance measuring have used constant current sources to charge sensing electrodes that effectively provide a limitless charge. In those cases, the charge shared with the sensing electrode is not reflected in the remaining charge, as any shared charge is immediately replaced by the input voltage or current.

The charge transfer circuit 108 is configured to controllably transfer charge from the storage capacitor 104 to the sensing electrode 102. It is important to note that the this controlled transfer of charge from the storage capacitor 104 to the sensing electrode 102 is not a simple sharing of charge such as would occur if the sensing electrode 102 was merely directly connected to the storage capacitor 104. In such a sharing, the result is that voltage equalizes on the sensing electrode 102 and the storage capacitor 104, i.e., the same voltage is on both elements. With the voltage on the storage capacitor 104 simply determined by voltage equalization, a measurement of the capacitance of the sensing electrode could not be determined from the remaining voltage on the storage capacitor 104.

In contrast, the charge transfer circuit 108 is configured to controllably transfer charge from the storage capacitor 104 to the sensing electrode 102 while measuring voltage on the sensing electrode 102. The charge transfer circuit ceases controllably transferring charge responsive to the measured voltage on the sensing electrode 102 reaching a defined level.

This leaves a residual voltage remaining on the storage capacitor 104 after the transfer.

The controlled transfer of charge can be implemented in a variety of ways. For example, by transferring charge through a transistor in saturation mode, and then turning off the transistor when the voltage on the sensing electrode reaches the defined level. Again, such a controlled transfer is not a simple sharing, as the voltage does not simply equalize to the same level. Instead, the controlled transfer is stopped when the measured voltage on the sensing electrode 102 reaches a defined level, with the remaining residual voltage on the storage capacitor determined by the relative capacitances on the storage capacitor 104 and the sensing electrode 102. As such, the remaining residual voltage on the storage capacitor 104 can be used to provide a measurement of the capacitance associated with the sensing electrode 102.

The measurement circuit 110 is thus coupled to the storage capacitor and configured to measure the residual voltage remaining on the storage capacitor 104. The measurement of the residual voltage is then used to determine the measurable capacitance associated with the sensing electrode 102. A variety of different techniques can be used to measure the residual voltage on the storage capacitor. For example, multi-bit techniques such as analog-to-digital (ADC) conversion can be used to provide an accurate measurement of residual voltage. Other possible techniques include relatively simple voltage comparisons that provide a one-bit measurement of voltage.

During operation of a typical proximity sensor device, the capacitive measurement device 100 will repeatedly determine the measurable capacitance at the sensing electrode 102. For example, a typical implementation can provide repeated measurements at a rate of 100 kHz. From those repeated cycles, the proximity sensor device can sense the changes in capacitance associated with proximate objects in a sensing region. Furthermore, in most typical proximity sensor devices, a plurality of sensing electrodes 102 are used to provide positional information for objects that are in the sensing region. In these embodiments, the capacitive measurement device 100 would be implemented with a plurality of storage capacitors, charging circuits, charge transfer circuits, and measurement circuits, with each of these used to determine the measurable capacitance of an associated sensing electrode. For example, in some two-dimensional sensors, there could be tens of sensing electrodes, with their associated circuits used to repeatedly determine the associated measurable capacitances and thus provide precise positional information of proximate objects. Details of such devices will be discussed in greater detail below with reference to FIG. 9. It should also be noted that in some embodiments, the storage capacitor can be shared between multiple sensor electrodes. For example, by using a multiplexer coupled to the storage capacitor. In this embodiment, the one storage capacitor would be shared through time multiplexing the capacitor with multiple sensor electrodes. In one such embodiment only one sensor for each multiplexer would be active at any give time.

Figure 2:
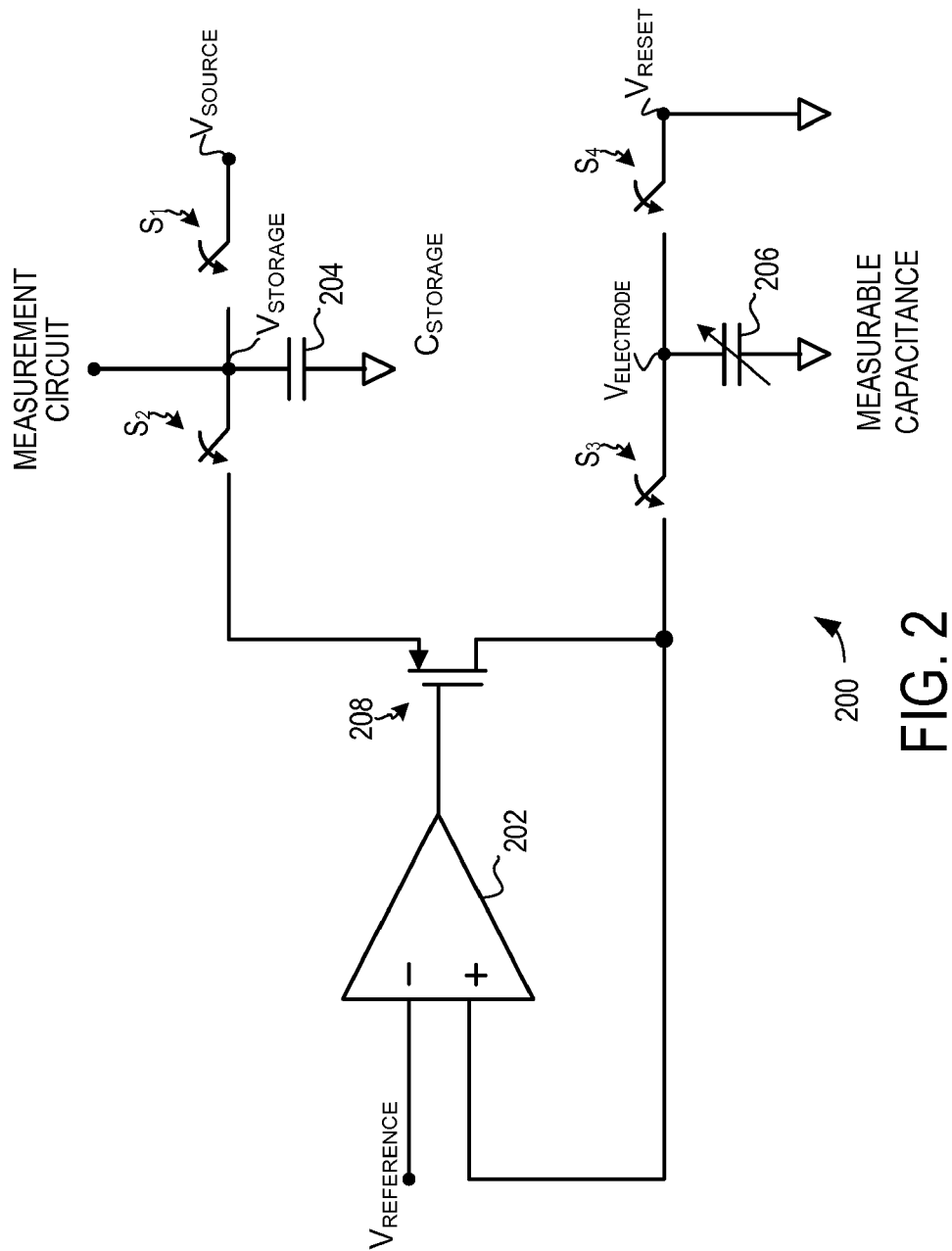
FIG. 2 is a schematic drawing of a capacitive measuring device in accordance with an embodiment of the invention.

Turning now to FIG. 2, a first embodiment of a capacitive measuring device 200 is illustrated schematically. The capacitive measuring device 200 includes a comparator 202, a transistor 208, a storage capacitor 204, a sensing electrode (illustrated as its associated variable measurable capacitance 206), and switches $S_1$, $S_2$, $S_3$, and $S_4$. Also identified in FIG. 2 are nodes where particular voltages exist ($V_{SOURCE}$, $V_{STORAGE}$, $V_{ELECTRODE}$, $V_{RESET}$, $V_{REFERENCE}$). In capacitive measuring device 200, a voltage source and switches $S_1$ and $S_2$ function as the charging circuit configured to selectively charge the storage capacitor 204 to a predetermined level. Specifically, with switch $S_1$ closed and switch $S_2$ open, the storage capacitor 204 is charged to a voltage $V_{SOURCE}$ (which is provided by a voltage source not illustrated in FIG. 2). This puts a discrete and set amount of charge of $Q=C_{STORAGE}*V_{SOURCE}$ on the storage capacitor 204

The comparator 202 and transistor 208 provide a charge transfer circuit for the capacitive measuring device 200. Specifically, the comparator 202 and the transistor 208 are configured to controllably transfer charge from the storage capacitor 204 to the variable measurable capacitance 206 with the switches $S_2$ and $S_3$ are closed. In the illustrated embodiment, the comparator 202 compares the voltage $V_{ELECTRODE}$ on the measurable capacitance 206 with a reference voltage $V_{REFERENCE}$ (which is provided by a voltage source not illustrated in FIG. 2). The transistor 208 in this embodiment comprises a p-channel field effect transistor (PFET). When the voltage on measurable capacitance 206 is less than the reference voltage, the comparator 202 biases transistor 208 in the saturation region. This allows current to flow through the transistor 208, but at a controllable rate. When the measurable capacitance is charged to a voltage equal to $V_{REFERENCE}$, the comparator 202 turns off the transistor 208, thus ending the controlled transfer of charge from the storage capacitor 204 to the measurable capacitance 206. Again, the rate of transfer is controlled by the operation of the transistor 208 in the saturation region. Thus, the controlled transfer does not result in simple sharing and voltage equalization that would occur in an uncontrolled connection between the nodes.

After the controlled transfer of charge to the measurable capacitance 206, the residual voltage at the storage capacitor 204 ($V_{STORAGE}$) is measured using the measurement circuit coupled to node. The measurement of the residual voltage can then be used to determine the capacitance $C_{MEASURABLE}$ of the measurable capacitance 206.

Specifically, the initial set charge on the storage capacitor is defined by $Q=C_{STORAGE}*V_{SOURCE}$. During transfer, an amount of charge equal to $C_{MEASURABLE}*V_{REFERENCE}$ is transferred from the storage capacitor 204 to the measurable capacitance 206. The remaining residual voltage on the storage capacitor 204 is thus $V_{STORAGE}=V_{SOURCE}-(C_{MEASURABLE}/C_{STORAGE})*V_{REFERENCE}$. As the remaining residual voltage is proportional to the capacitance $C_{MEASURABLE}$ of the measurable capacitance 206, a measurement of the remaining residual voltage can be used to determine the measurable capacitance. It should be noted that because the residual voltage is proportional to the measurable capacitance 206, the measurement of the residual voltage is linear with respect to the measurable capacitance. This can result in improved performance. Specifically, this can simplify the calculation of the measurable capacitance, as complex calculations such as inverses are not required. Furthermore, as calculating the measurable capacitance from the residual voltage is less computationally intensive, it can be implemented with simpler devices. Furthermore, the ratio of capacitance $C_{MEASURABLE}/C_{STORAGE}$ sets the gain of this measurement. Again, a variety of different techniques can be used to measure the residual voltage on the storage capacitor 204. For example, multi-bit techniques such as analog-to-digital (ADC) conversion can be used to provide an accurate measurement of residual voltage and hence the measurable capacitance $C_{MEASURABLE}$.

Finally, the switch $S_4$ is provided to allow the voltage on the measurable capacitance to be reset to known voltage $V_{RESET}$ in between measurements. In this case, the known voltage is a local ground, but other voltage voltages could also be used.

As stated above, in one example, the transistor 208 comprises a p-channel FET such as a MOSFET. For a p-channel MOSFET to stay in saturation, the voltage across the source and drain of the transistor (called the source-drain voltage, $V_{SD}$) must be greater than the difference between the voltage across the gate and source (called the source-gate voltage, $V_{SG}$) and the threshold voltage of the device, $V_T$, which is a process parameter for the MOSFET (typically, about 0.9V for a 0.35 μm CMOS process). In the literature, this difference in voltage between $V_{GS}$ and $V_T$ is called the overdrive or saturation voltage of the device, denoted as $V_{OV}$ or $V_{SD,SAT}$. In many typical signal processing applications, circuits are designed such that $V_{OV}$ is approximately 100 mV.

Since in device 200, $V_{SOURCE}$ is the source voltage for the transistor 208, and the voltage $V_{ELECTRODE}$ on the measurable capacitance 206, is the drain voltage of the device, then, to be in saturation:

$$V_{SOURCE} - V_{ELECTRODE} > V_{OV}$$

At the end of a cycle of charging measurable capacitance 206, it has a voltage of $V_{REFERENCE}$. Thus, in order to stay in saturation:

$$V_{SOURCE} - V_{REFERENCE} > V_{OV}$$

and $$V_{SOURCE} > V_{OV} + V_{REFERENCE}$$

Thus in most typical applications, $V_{SOURCE}$ and $V_{REFERENCE}$ should be selected such that $V_{SOURCE}$ is greater than $V_{REFERENCE}$ by at least an amount equal to $V_{OV}$ at the end of the sensing cycle, i.e., even after the voltage at $V_{SOURCE}$ has increased due to charging the measurable capacitance 206.

In a similar way, the size of the storage capacitor 204 should be selected based on the capacitance of the measurable capacitance 206 that is to be measured. Furthermore, the relationship is interrelated with the relationship between $V_{SOURCE}$ and $V_{REFERENCE}$. Specifically, as the size of the storage capacitor 204 becomes larger, the difference between $V_{SOURCE}$ and $V_{REFERENCE}$ can become smaller.

In general, there should be enough charge to be stored on storage capacitor 204 so that it can be transferred to measurable capacitance 206, and for the voltage on storage capacitor 204 to be greater than that measurable capacitance 206 at all times. Thus, in one embodiment, the storage capacitor 204 should be at least twice as large as the largest possible measurable capacitance 206. This embodiment relies on having a $V_{REFERENCE}$ and $V_{SOURCE}$ such that:

$$V_{REFERENCE} < (2/3)*(V_{SOURCE} - V_{OV})$$

Furthermore, since the storage capacitor 204 is being used in place of a fixed voltage source, it is generally preferred to have the capacitance of the storage capacitor 204 be much greater than the largest possible measurable capacitance 206, such as a ratio of 100 times greater. When the storage capacitor 204 is this large, it will appear as a fixed voltage source. The consequence of this is that the residual voltage on the storage capacitor 204 after the transfer of charge becomes smaller and smaller as the ratio of the storage capacitance 204 to measurable capacitance 206. Furthermore, it may then become desirable to add a gain stage on the output of the circuit at $V_{SOURCE}$.

Figure 3:
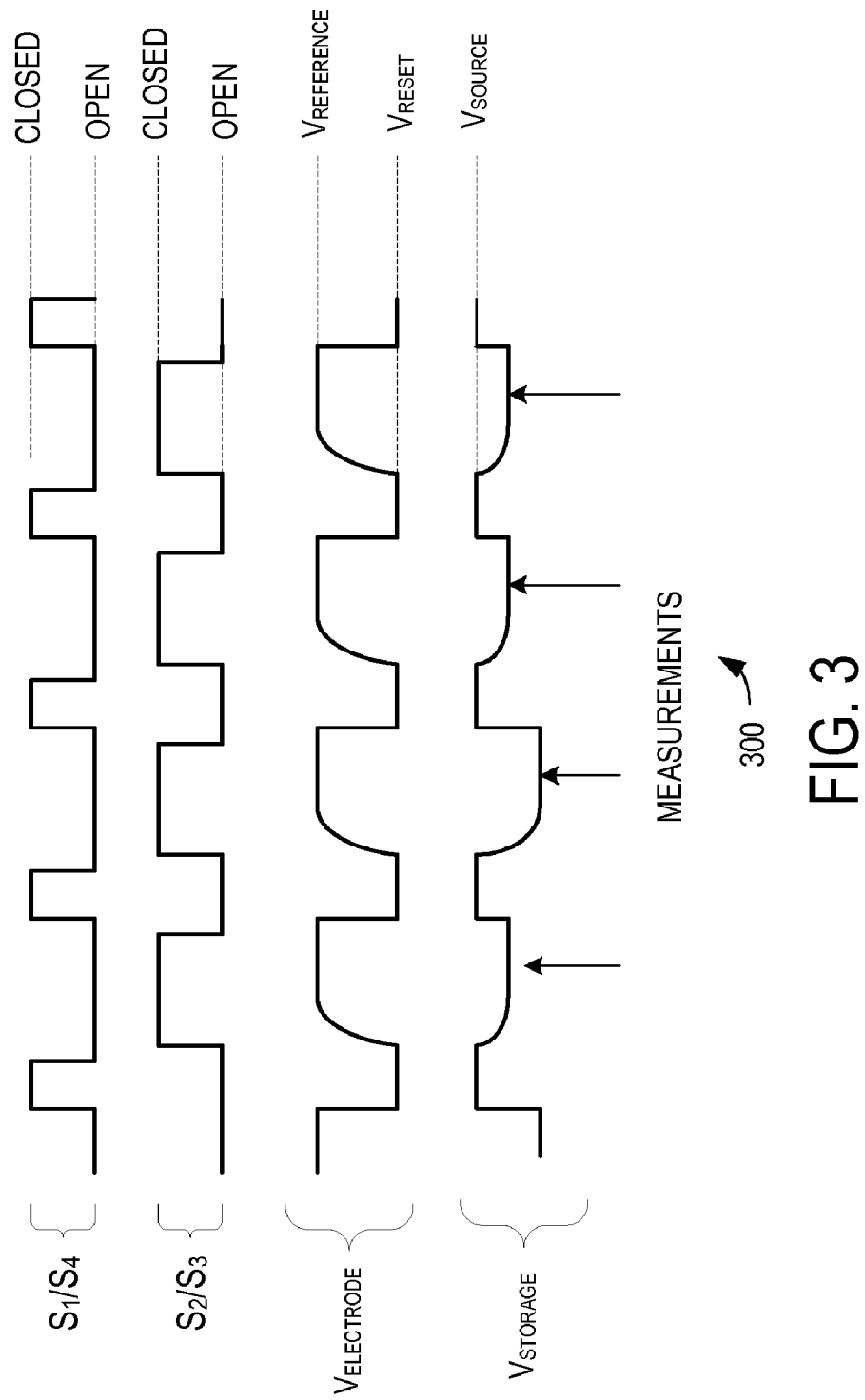
FIG. 3 is a graphical view of exemplary switch states and voltage waveforms in accordance with an embodiment of the invention.

Turning now to FIG. 3, graph 300 illustrates exemplary waveforms of voltages $V_{STORAGE}$ and $V_{ELECTRODE}$, as measured at the storage capacitor 204 and measurable capacitance 206, along with the switch states for several cycles of capacitive measuring in the device 200 of FIG. 2. The graph 300 shows how in between each measurement cycle, in response to switches $S_1$ and $S_4$ closing, the voltage $V_{ELECTRODE}$ is set to the reset voltage $V_{RESET}$, and the voltage $V_{STORAGE}$ is set to the source voltage $V_{SOURCE}$. The graph 300 further shows how, in response to switches $S_2$ and $S_3$ closing, the voltage on the storage capacitor 204 is controllably transferred to the measurable capacitance 206, as indicated by a rise in $V_{ELECTRODE}$ and a decline in $V_{STORAGE}$. Each transfer cycle ends when the voltage $V_{ELECTRODE}$ reaches the reference voltage $V_{REFERENCE}$. As is clearly shown in FIG. 3, the amount of decline in $V_{STORAGE}$ occurring in each transfer cycle varies with the measurable capacitance. Specifically, FIG. 3 shows four transfer cycles, and identifies four locations in the $V_{STORAGE}$ waveform where the measurement circuit can measure the voltage and determine the associated measurable capacitance for that point in time.

Figure 4:
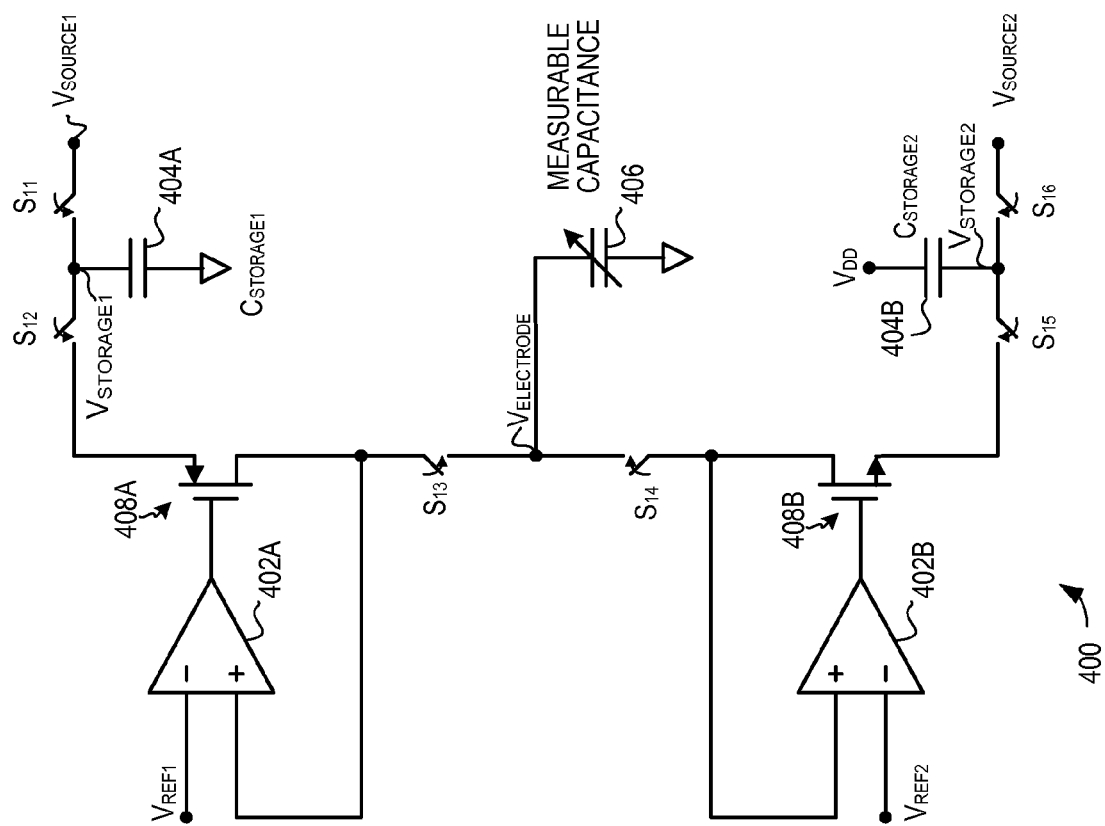
FIG. 4 is a schematic drawing of a capacitive measuring device in accordance with an embodiment of the invention.
Figure 5:
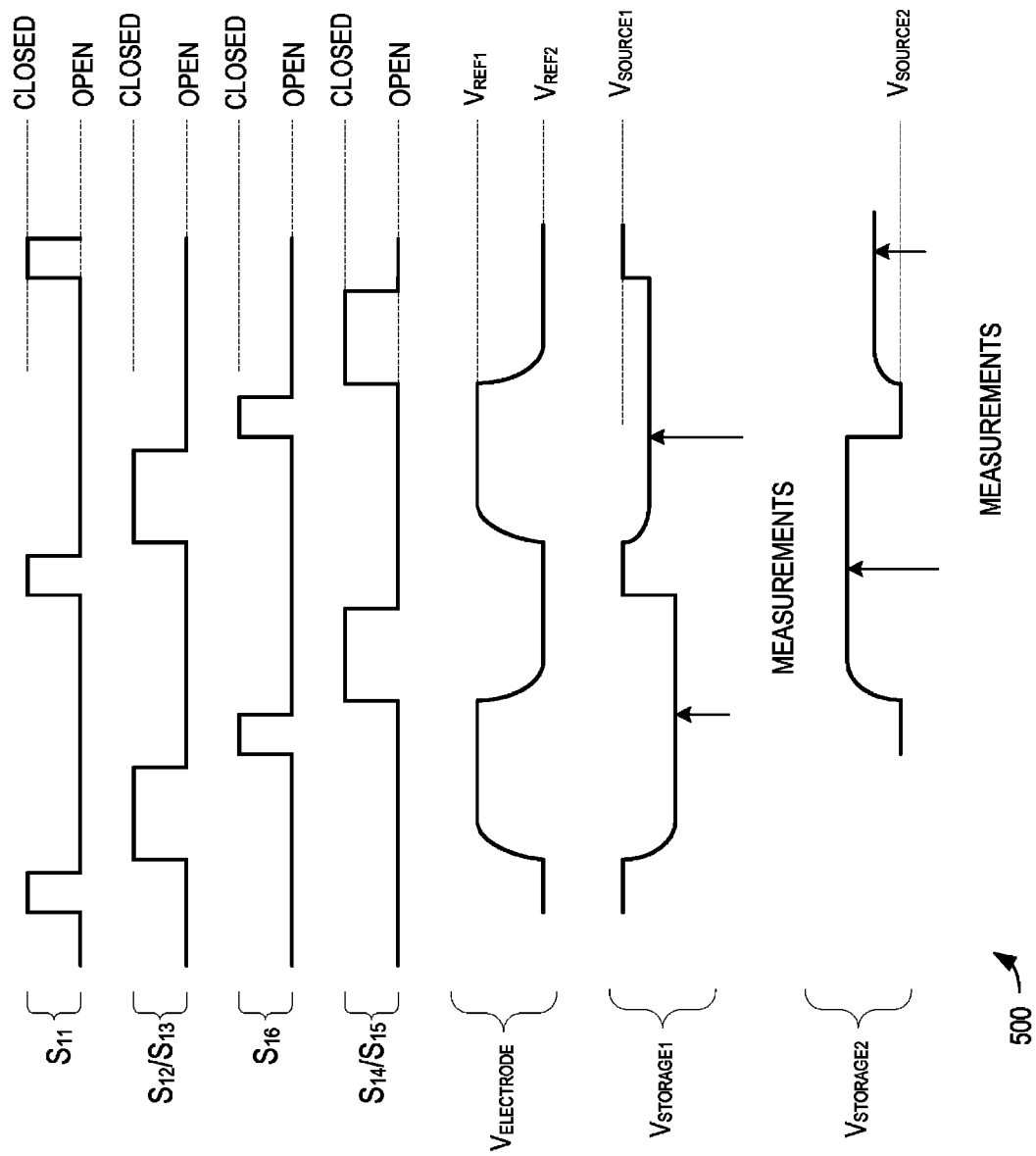
FIG. 5 is a graphical view of exemplary switch states and voltage waveforms in accordance with an embodiment of the invention.

The embodiments illustrated in FIGS. 2 and 3 controllably transfer in only one direction, i.e., increasing the voltage on the measurable capacitance while decreasing the voltage on the storage capacitor, and then reset the voltage on the measurable capacitance. Turning now to FIGS. 4 and 5, a second embodiment of a capacitive measuring device 400 is illustrated. In this embodiment, the device controllably transfers charge both to and from a measurable capacitance 406, and determines the capacitance from alternating residual voltage measurements at two storage capacitors 404A and 404B. Also identified in FIG. 4 are nodes where there exist particular voltages ($V_{SOURCE1}$, $V_{SOURCE2}$, $V_{STORAGE1}$, $V_{STORAGE2}$, $V_{ELECTRODE}$, $V_{REF1}$, $V_{REF2}$).

The capacitive measuring device 400 includes two comparators 402A-B, two transistor s 408A-B, two storage capacitor 404A-B, a sensing electrode (again illustrated as its associated variable measurable capacitance 406), and switches $S_{11}$, $S_{12}$, $S_{13}$, $S_{14}$ $S_{15}$, and $S_{16}$. In capacitive measuring device 400 switches $S_{11}$, $S_{12}$ and a voltage source function as the charging circuit configured to selectively charge the storage capacitor 404A. Likewise, switches $S_{15}$, $S_{16}$ and a voltage source function as the charging circuit configured to selectively charge the storage capacitor 404B. Thus, the storage capacitors 404A-404B can both be charged to a discrete and set amount of charge.

The comparator 402A and transistor 408A provide a charge transfer circuit for controllably transferring charge from the storage capacitor 404A to the variable measurable capacitance 406 with the switches $S_{12}$ and $S_{13}$ are closed. Likewise, during alternating cycles, the comparator 402B and transistor 408B provide a charge transfer circuit for controllably transferring charge from the storage capacitor 404B to the variable measurable capacitance 406 with the switches $S_{15}$ and $S_{14}$ are closed.

In the illustrated embodiment, the comparator 402A compares the voltage $V_{ELECTRODE}$ on the measurable capacitance 406 with a reference voltage $V_{REF1}$. The transistor 408A in this embodiment comprises a p-channel field effect transistor (PFET). When the voltage on measurable capacitance 406 is less than the reference voltage $V_{REF1}$, the comparator 402A biases transistor 408A in the saturation region. This allows current to flow through the transistor 408A (which transfers charge from the storage capacitor 404A), but at a controllable rate. When the measurable capacitance is charged to a voltage equal to $V_{REF1}$, the comparator 402A turns off the transistor 408A, thus ending the controlled transfer of charge from the storage capacitor 404A to the measurable capacitance 406.

After the controlled transfer of charge to the measurable capacitance 406, the residual voltage at the storage capacitor 404A ($V_{STORAGE1}$) is measured using the measurement circuit coupled to the storage capacitor 404A (not shown in FIG). The measurement of the residual voltage can then be used to determine the capacitance $C_{MEASURABLE}$ of the measurable capacitance 406.

During alternating measurement cycles, the comparator 402B compares the voltage $V_{ELECTRODE}$ on the measurable capacitance 406 with a reference voltage $V_{REF2}$. The transistor 408B in this embodiment comprises a n-channel field effect transistor (NFET). When the voltage on measurable capacitance 406 is greater than the reference voltage $V_{REF2}$, the comparator 402B biases transistor 408B in the saturation region. This allows current to flow through the transistor 408B (which transfers charge from the storage capacitor 404B), but at a controllable rate. When the measurable capacitance is charged to a voltage equal to $V_{REF2}$, the comparator 402B turns off the transistor 408B, thus ending the controlled transfer of charge from the storage capacitor 404B to the measurable capacitance 406.

After the controlled transfer of charge to the measurable capacitance 406, the residual voltage at the storage capacitor 404B ($V_{STORAGE2}$) is measured using the measurement circuit coupled to the storage capacitor 404B (not shown in FIG). The measurement of the residual voltage can then be used to determine the capacitance $C_{MEASURABLE}$ of the measurable capacitance 406.

It should be noted that in this application the term "transfer charge" can refer to the transfer of both positive charge and negative charge. Thus, when charge is controllably transferred from the storage capacitor to the sensing electrode, it can take the form of positive charge being transferred from a storage capacitor at a relatively high voltage (e.g., storage capacitor 404A) to a relatively low voltage electrode (e.g., measurable capacitance 406). In this case, the current flows in the same direction as the charge is transferred (although opposite the direction of actual electron movement). Alternatively, it can take the form of negative charge being transferred from a storage capacitor at a relatively low voltage (e.g., storage capacitor 404A) to a relatively high voltage electrode (e.g., measurable capacitance 406). In this case, the current flows in the opposite direction as the charge is transferred.

Graph 500 of FIG. 5 illustrates exemplary waveforms of voltages $V_{STORAGE1}$, $V_{STORAGE2}$ and $V_{ELECTRODE}$, as measured at the storage capacitors 404A-B and measurable capacitance 406, along with the switch states for several cycles of capacitive measuring in the device 400 of FIG. 4. The graph 500 shows how between measurement cycles, in response to switches $S_{11}$ and $S_{16}$ closing, the voltages $V_{STORAGE1}$ and $V_{STORAGE2}$ are set to voltages $V_{SOURCE1}$ and $V_{SOURCE2}$ respectively. The graph 500 further shows how, in response to switches $S_{12}$ and $S_{13}$ closing, the charge on the storage capacitor 404A is controllably transferred to the measurable capacitance 406, as indicated by a rise in the voltage $V_{ELECTRODE}$ and a decline in the voltage $V_{STORAGE1}$. This transfer ends when the voltage $V_{ELECTRODE}$ reaches the first reference voltage $V_{REF1}$.

Then, in alternating measurement cycles, in response to switches $S_{14}$ and $S_{15}$ closing, the charge on the storage capacitor 404B is controllably transferred to the measurable capacitance 406, as indicated by a decline in $V_{ELECTRODE}$ and a rise in $V_{STORAGE2}$. This transfer ends when the voltage $V_{ELECTRODE}$ reaches the second reference voltage $V_{REF2}$.

As is clearly shown in FIG. 5, the amount of decline in $V_{STORAGE1}$ occurring in alternating transfer cycles, and the amount of rise in $V_{STORAGE2}$ occurring in the other alternating cycles, varies with the measurable capacitance 406. Specifically, FIG. 5, shows four transfer cycles, two from $V_{STORAGE1}$ and two from $V_{STORAGE2}$, and identifies two locations in the $V_{STORAGE1}$ waveform and two locations in the $V_{STORAGE2}$ waveform where the measurement circuits can measure the voltage and determine the associated measurable capacitance at those points in time.

It should be noted that because this embodiment increases the voltage on the measurable capacitance 406 with a transfer from one storage capacitor, and then decreases the voltage with a transfer from the other storage capacitor, the use of another voltage source to reset the measurable capacitance 406 is not needed. Instead, the controlled transfers of charge move the electrode to the reference voltages $V_{REF1}$ and $V_{REF2}$ effectively reset the voltage on the measurable capacitance 406 during each cycle.

It should also be noted that this embodiment effectively introduces a modulation of the measurements. Specifically, the ramp up of the voltage on the measurable capacitance 406 acts as a multiply by +1 and the ramp down acts as a multiply −1. To combine these modulated measurements, a mixer or other demodulator is used to combine the two signals to provide a stream of measurements that use the same reference.

Figure 6:
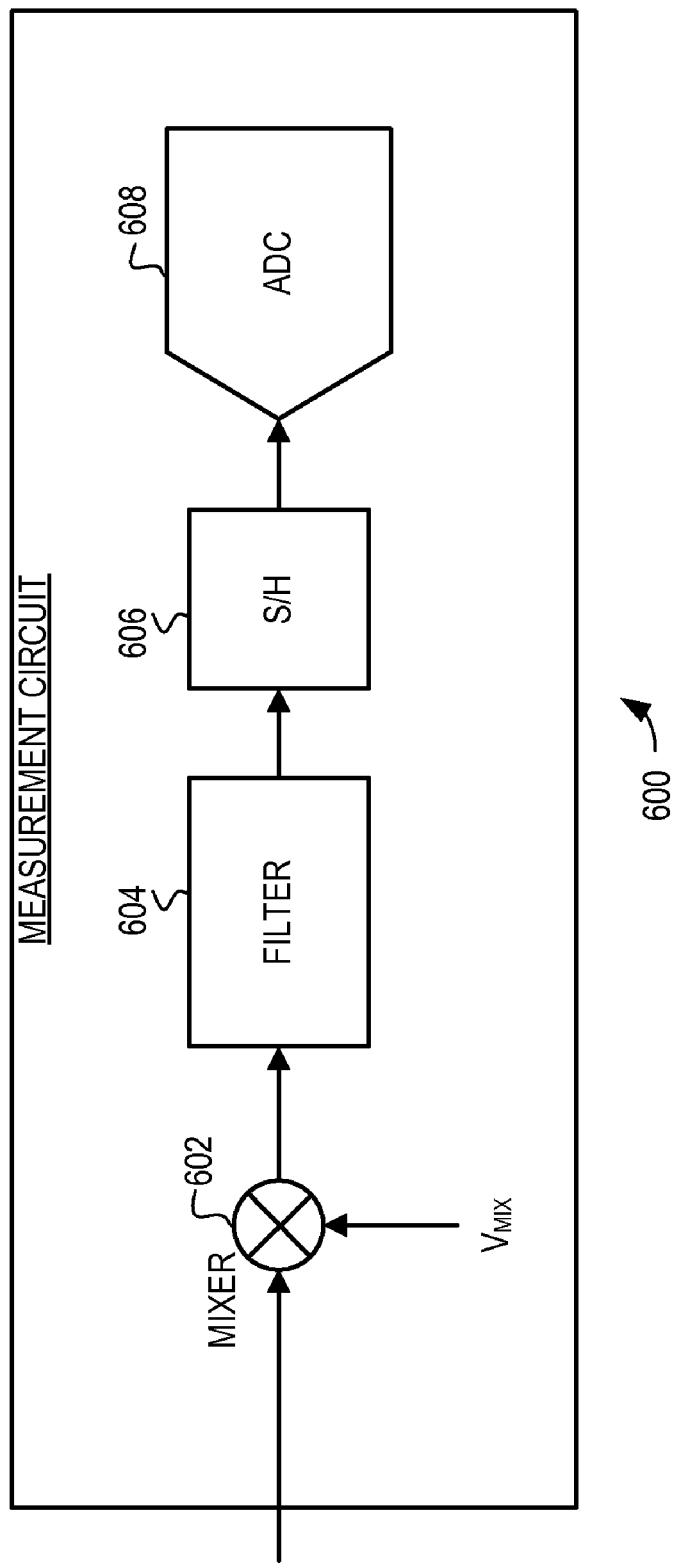
FIG. 6 is a schematic drawing of a measurement circuit in accordance with an embodiment of the invention.

Turning now to FIG. 6, an embodiment of a measurement circuit 600 that includes a mixer for demodulation is illustrated schematically. The measurement circuit 600 includes a mixer 602, a filter 604, a sample/hold (S/H) device 606, and an analog-to-digital converter (ADC) 608. The mixer 602 receives the voltages $V_{STORAGE1}$ and $V_{STORAGE2}$, and demodulates the signal, which was modulating the carrier frequency that resulted from successive charging and discharging of the measurable capacitance. The signal is then filtered and input to a sample/hold device 606 which is used to hold the input to the ADC 608 long enough for the ADC 608 to complete a conversion to a digital format. The ADC 608 converts the signal of interest into a digital format.

Regarding the modulation/demodulation procedure, the successive charging and discharging of the measurable capacitance, at a given frequency, conceptually amounts to a modulation of the charge measurement onto a carrier signal. This modulation provides benefits in signal processing by changing the frequency at which a sensed signal is processed in the frequency spectrum. In this instance, the signal of interest, i.e., the charge on the measurable capacitance, when used for human interface sensing has a typical bandwidth of approximately 0.1 Hz to 40 Hz. This signal is in a portion of the frequency spectrum which is susceptible to noise and interference from various low frequency sources such as 60 Hz lighting and electronic noise in silicon circuits, such as 1/f (commonly referred to as 'flicker' noise) which manifests itself in the lower portion of the frequency spectrum. By moving this signal to a higher portion of the frequency spectrum centered around the carrier signal frequency, the effects of these noise sources are mitigated, since their power at the higher carrier frequency is much attenuated. Gain can also be applied to the signal of interest, so that its magnitude is higher than the magnitude of noise sources in the lower portion of the frequency spectrum Thus, as a result of the modulation procedure, the signal of interest is now at a higher portion of the frequency spectrum. As stated above, this reduces the effects of noise on the signals. However, as it easier to process this signal if it is in a lower portion of the frequency spectrum, it is desirable in most embodiments to demodulate the signal of interest so that it again is in a lower portion of the frequency spectrum. The mixer 602 in FIG. 6 is thus used to demodulate (or move the location of the signal of interest) to a lower portion of the frequency spectrum.

It is also desirable in most embodiments to filter the signal of interest after demodulation, since demodulation usually produces extra frequency components (tones) that are not the signal of interest. These tones are also commonly referred to as intermodulation products. A detailed explanation of suitable modulation/demodulation procedures can be found in most signal processing or radio frequency circuit design textbooks.

Figure 7:
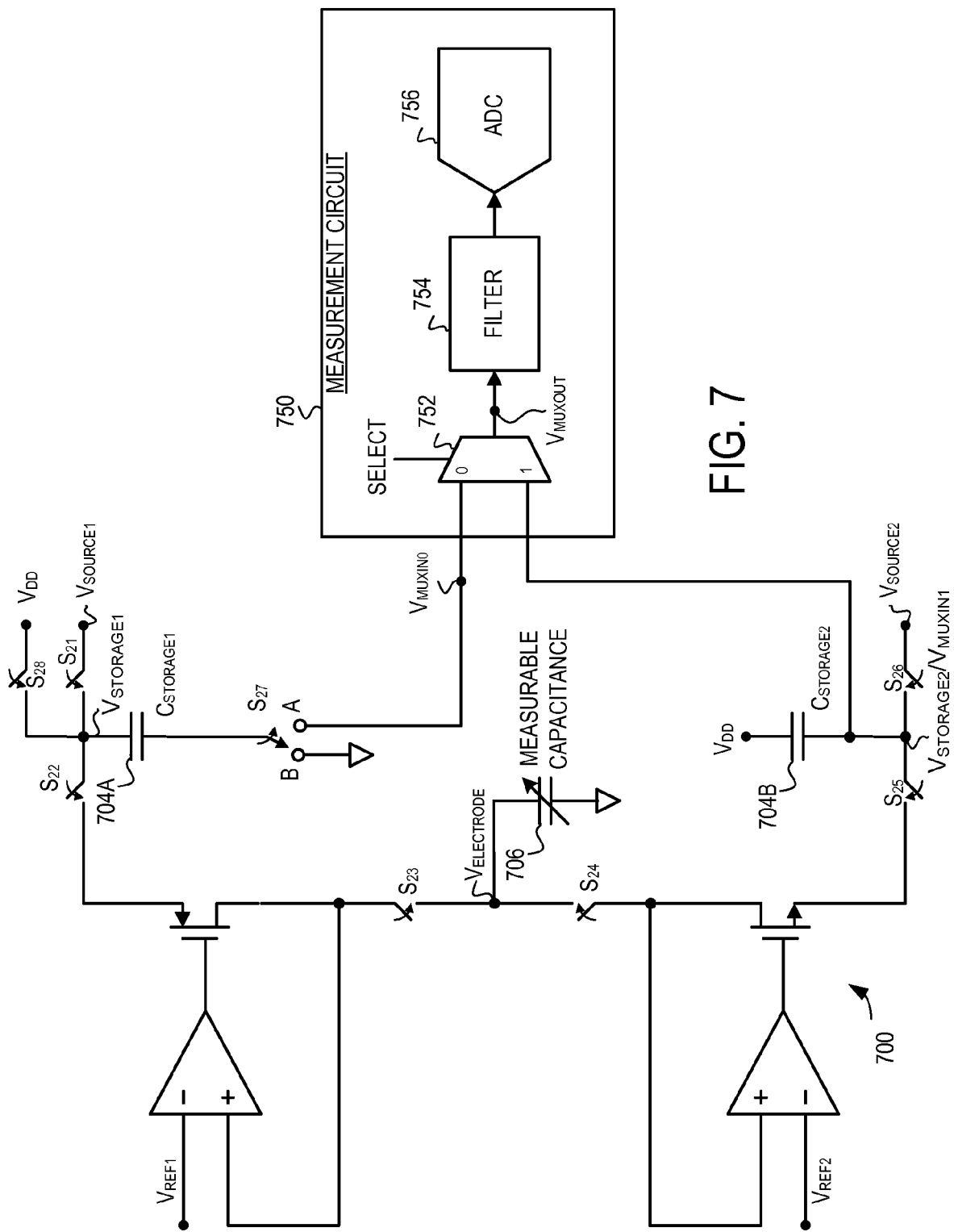
FIG. 7 is a schematic drawing of a capacitive measuring device in accordance with an embodiment of the invention.
Figure 8:
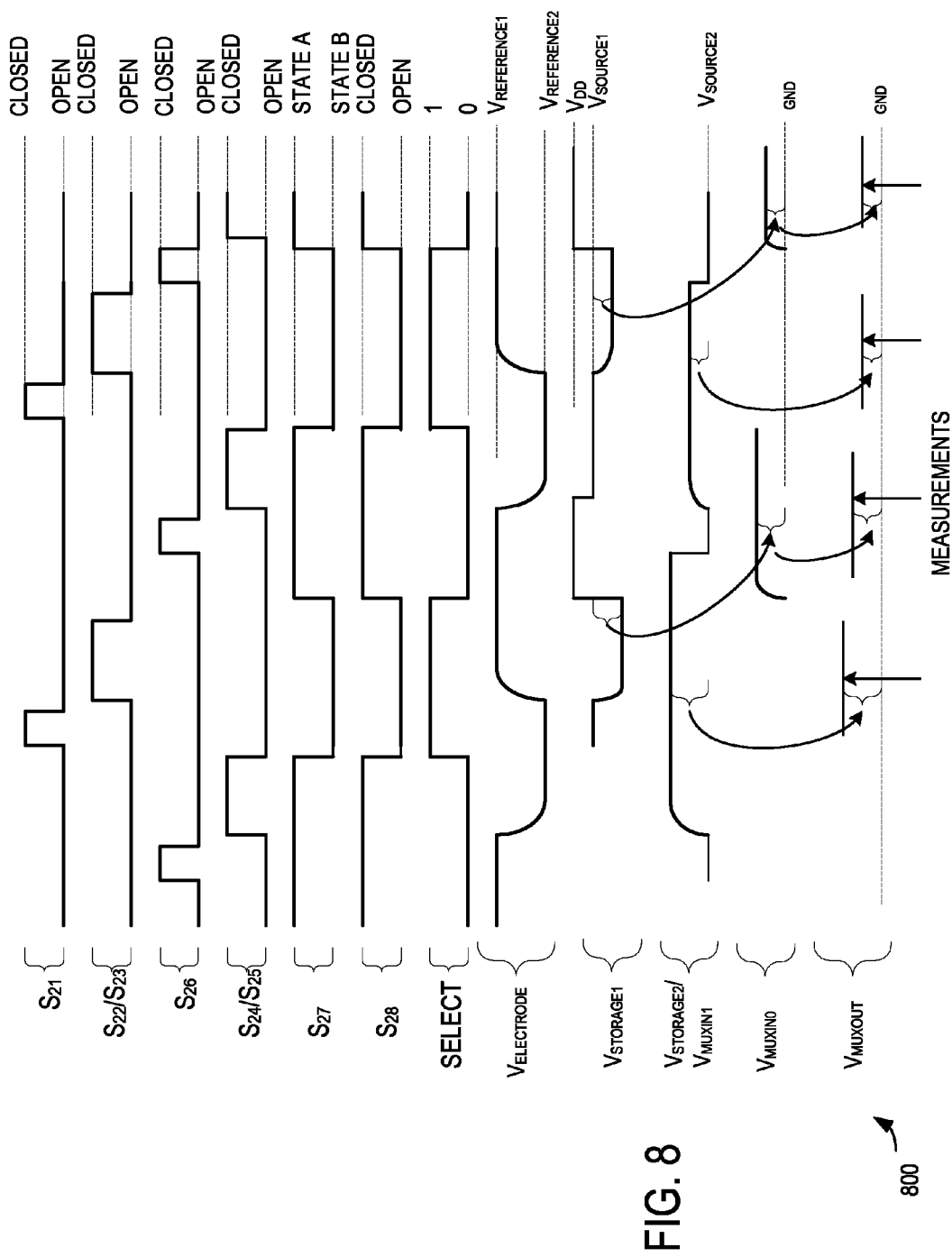
FIG. 8 is a graphical view of exemplary switch states and voltage waveforms in accordance with an embodiment of the invention.

Turning now to FIGS. 7 and 8, a third embodiment of a capacitive measuring device 700 is illustrated. In this embodiment, like the second embodiment, the device controllably transfers charge both to and from a measurable capacitance 706, and determines the capacitance from alternating residual voltage measurements at two storage capacitors 704A and 704B. However, this embodiment provides a different technique from the second embodiment for combining the residual voltage measurements at two storage capacitors 704A and 704B. Also identified in FIG. 7 are nodes where there exist particular voltages ($V_{SOURCE1}$, $V_{SOURCE2}$, $V_{STORAGE1}$, $V_{STORAGE2}/V_{MUXIN1}$, $V_{ELECTRODE}$, $V_{REF1}$, $V_{REF2}$, $V_{RMUXIN0}$, $V_{MUXOUT}$).

Specifically, in this embodiment switches $S_{28}$, $S_{21}$ and $S_{27}$ allow for the changing of connections to the place of the storage capacitor 704A so that the polarity of the voltage input to the mixer is reversed, and the voltage is referenced to ground instead of $V_{DD}$. Thus, the two sets of voltage waveforms from storage capacitors 704A and 704B are both referenced to ground, and can easily be demodulated in the signal processing circuitry that follows the multiplexer 752.

During controlled transfer of charge from the storage capacitor 704A to the measurable capacitance 706, switches $S_{22}$ and $S_{23}$ are closed, switches $S_{21}$ and $S_{28}$ are open, and switch $S_{27}$ is set to state B. In this configuration, the measuring device 700 performs exactly as the device 400 in FIG. 4, i.e., controllably transferring charge from storage capacitor 704A to the measurable capacitance 706, and leaving a residual voltage on the storage capacitor 704A after the transfer.

Then, instead of the measurement circuit directly measuring this residual voltage on storage capacitor 704A, the plates of the capacitor 704A are "reversed" by changing switch $S_{27}$ to state A, and closing switch $S_{28}$. This reversing of plates does not change the amount of charge remaining on the capacitor 704A, but it does allow the measurement circuit 750 to directly measure the change in voltage on capacitor 704A with reference to the voltage ground instead of $V_{DD}$. As will be explained in greater detail below, this measurement can then be directly combined by the multiplexer in measurement circuit 750 without any additional multiplication for demodulation.

This feature is illustrated in graph 800 of FIG. 8. The waveforms of voltages $V_{STORAGE1}$, $V_{STORAGE2}$ and $V_{ELECTRODE}$ are similar to those in FIG. 5. In this embodiment, the voltage $V_{STORAGE2}$ is passed directly to the input 1 of multiplexer 752 as $V_{MUXIN1}$, and then passed to the filter 754 and ADC 756 as $V_{MUXOUT}$ when the multiplexer SELECT signal is high. Conversely, the voltage $V_{STORAGE1}$, is first converted to a "delta" voltage measured with respect to ground using switches $S_{27}$ and $S_{28}$, as illustrated in the waveform for $V_{MUXIN0}$. $V_{MUXIN0}$, a converted reference representation of the residual voltage $V_{STORAGE1}$, is passed to the input 0 of multiplexer 752, and then passed to the filter 754 and ADC 756 as $V_{MUXOUT}$ when the multiplexer SELECT signal is low.

The result is a signal $V_{MUXOUT}$ that is the combination of the signals $V_{MUXIN0}$ and $V_{MUXIN1}$. These signals, $V_{MUXIN0}$ and $V_{MUXIN1}$, represent the two sets of modulated signals from the measurable capacitance 706, which are present on the storage capacitors 704A and 704B. The changing of the plate connections of storage capacitor 704A makes the signal on this capacitor referenced to ground, just like the signal on storage capacitor 704B. The process of combining the signal on storage capacitor 704A (whose reference has been changed to ground from $V_{DD}$) with the signal on storage capacitor 704B acts as a demodulation. The signal can then be filtered by the filter 754 following the multiplexer 752 to remove unwanted content in the frequency spectrum. The ADC 756 then provides the digital format output of the circuit. FIG. 8 shows four transfer cycles, two of $V_{STORAGE1}$ from storage capacitor 704A and two of $V_{STORAGE2}$ from storage capacitor 704B, and identifies four locations in the resulting $V_{MUXOUT}$ waveform where the delta voltage can be measured to determine the associated measurable capacitance for those points in time.

The embodiments thus provide systems and methods for determining measurable capacitances that are applicable to proximity sensor devices. The systems and methods measure capacitance by controllably transferring charge from a storage capacitor, and determining the measurable capacitance by measuring the residual voltage remaining on the storage capacitor after the transfer. Because the system and method measures at the storage capacitor and not the sensing electrode, it provides for the use of simplified measurement techniques and good noise rejection. The systems and methods thus can provide an accurate determination of the measurable capacitance that can be used for object proximity sensing.

Furthermore, the system and methods can provide several potential advantages. As discussed above, because the measurement of the residual voltage can be linear with respect to the measurable capacitance, device performance and simplicity can be improved. Furthermore, because in typical human interface applications the object motion in a sensing region has a "frequency" on the order of 40 Hz, some previous capacitance measurement techniques have been particularly susceptible to noise from common sources (such as fluorescent lights, which typically emanate noise at 60 Hz). Because the modulating techniques described above mix the measurements with a relatively high frequency carrier, the measurements are frequency shifted away from these common noise sources. Finally, because the technique approximates a driven voltage it source, it provides first order immunity to noise and transcapacitance, and thus may not require a guarding ring in many applications.

Figure 9:
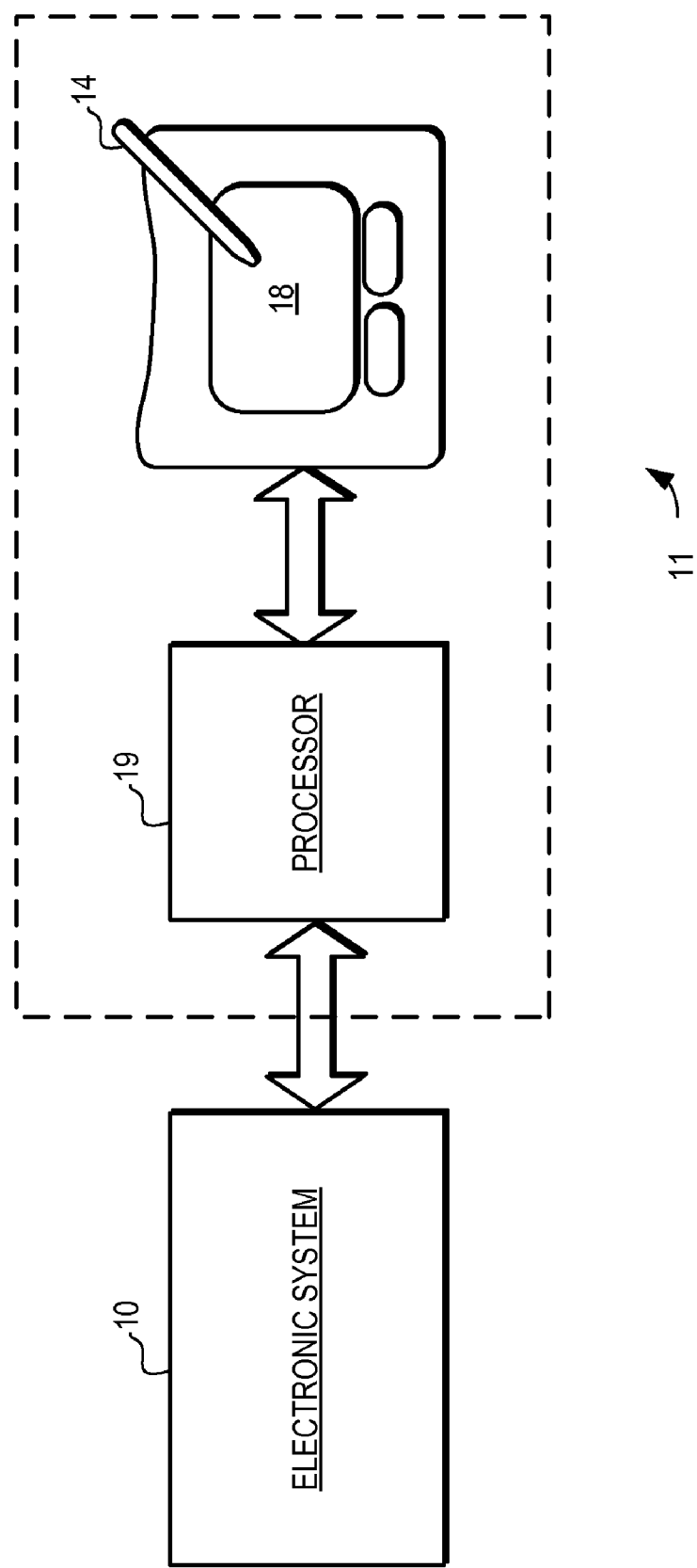
FIG. 9 is a block diagram of an exemplary system that includes a proximity sensor device in accordance with an embodiment of the invention.

Turning now to FIG. 9, a block diagram is illustrated of an exemplary electronic system 10 that operates with a capacitive proximity sensor device 11. The capacitive proximity sensor device 11 is an example of the type of device that can utilize the capacitive measurement devices and method described above.

Electronic system 10 is meant to represent any type of personal computer, portable computer, workstation, personal digital assistant, video game player, communication device (including wireless phones and messaging devices), media device, including recorders and players (including televisions, cable boxes, music players, and video players), digital camera, video camera or other device capable of accepting input from a user and of processing information. Accordingly, the various embodiments of system 10 may include any type of processor, memory or display. Additionally, the elements of system 10 may communicate via a bus, network or other wired or wireless interconnection, including I2C, SPI, PS/2, Universal Serial Bus (USB), Bluetooth, RF, IRDA, or any other type of wired or wireless connection to list several non-limiting examples.

The capacitive proximity sensor device 11 is implemented with a processor 19 and having a sensing region 18. The capacitive proximity sensor device 11 is sensitive to positional information, such as the position of a stylus 14, finger and/or other input object within the sensing region 18. "Sensing region" 18 as used herein is intended to broadly encompass any space above, around, in and/or near the proximity sensor device wherein the sensor is able to detect the object. In a conventional embodiment, sensing region 18 extends from the surface of the sensor in one or more directions for a distance into space until signal-to-noise ratios prevent object detection. This distance may be on the order of less than a millimeter, millimeters, centimeters, or more, and may vary significantly with the details of sensor technology used and the accuracy desired. Other embodiments may require contact with the surface, either with or without applied pressure. Accordingly, the planarity, size, shape and exact locations of the particular sensing regions 18 will vary widely from embodiment to embodiment.

In operation, the capacitive proximity sensor device 11 suitably detects positional information, such as the position, of stylus 14, a finger, and/or other input object within sensing region 18 by determining the resulting capacitances using the techniques described above. The capacitive proximity sensor device 11 provides electrical or electronic indicia of this positional information to the electronic system 10. The system 10 appropriately processes the indicia to accept inputs from the user, to move a cursor or other object on a display, or for any other purpose.

The capacitive measurement techniques used for object detection are advantageous to ones requiring moving mechanical structures (e.g. mechanical switches) that more easily wear out over time. In one typical application, the capacitive proximity sensor device can use arrays of capacitive sensing electrodes to support any number of sensing regions 18. The processor 19 is coupled to the electronic system 10. In general, the processor 19 receives electrical signals from the sensor of the proximity sensor device 11, processes the electrical signals, and communicates with the electronic system 10. The processor 19 can perform a variety of processes on the signals received from the sensor to implement the proximity sensor device 11. For example, the processor 19 can select or connect individual sensor electrodes, transfer charge, measure voltage, calculate position or motion information, or interpret object motion as gestures. As additional examples, processor 19 can also report positional information constantly, when a threshold is reached, or in response some criterion such as an identified gesture. The processor 19 can report indications to some part of the electronic system 10, cause changes directly to the display of the electronic system 100, provide indications directly to one or more users, just to name a few examples. The processor 19 can also determine when certain types or combinations of object motions occur proximate the sensor. For example, the processor 19 can determine the presence and/or location of multiple objects in the sensing region, and can generate the appropriate indication(s) in response to those object presences.

In this specification, the term "processor" is defined to include one or more processing elements that are adapted to perform the recited operations. Thus, the processor 19 can comprise all or part of one or more integrated circuits, firmware code, and/or software code needed to perform the recited operations. In some embodiments, all elements that comprise the processor 19 would be located together, with or near the sensor. In other embodiments, these elements would be physically separated, with some elements of the processor 19 close to the sensor, and/or some other portions of the electronic system 10. In this latter embodiment, minimal processing could be performed by the elements near the sensor, and the majority of the processing performed by the other elements elsewhere close to other portions of the electronic system 10.

Furthermore, the processor 19 can communicate with some part of the electronic system 10, and be physically separate from or integral with that part of the electronic system. For example, the processor 19 can reside at least partially on a microprocessor performing functions for the electronic system 10 different from implementing the proximity sensor device 11.

Again, as the term is used in this application, the term "electronic system" broadly refers to any type of device that operates with touch screen interface. The electronic system 10 could thus comprise any type of device or devices in which a proximity sensor device 11 can be implemented in or coupled to. The capacitive proximity sensor device 11 thus could be implemented as part of the electronic system 10, or coupled to the electronic system 10 using any suitable technique. As non-limiting examples the electronic system 10 could thus comprise any type of computing device, media player, communication device, or another input device (such as another touch sensor device or keypad). In some cases the electronic system 10 is itself a peripheral to a larger system. For example, the electronic system 10 could be a data input or output device, such as a remote control or display device, that communicates with a computer or media system (e.g., remote control for television) using a suitable wired or wireless technique. It should also be noted that the various elements (processor, memory, etc.) of the electronic system 10 could be implemented as part of an overall system, as part of the proximity sensor device, or as a combination thereof. Additionally, the electronic system 10 could be a host or a slave to the capacitive proximity sensor device 11.

In some embodiments the capacitive proximity sensor device 11 is implemented with buttons or other input devices near the sensing region 18. The buttons can be implemented to provide additional input functionality to capacitive proximity sensor device 11. For example, the buttons can be used to facilitate selection of items using the proximity sensor device. Of course, this is just one example of how additional input functionality can be added to the capacitive proximity sensor device 11, and in other implementations the capacitive proximity sensor device 11 could include alternate or additional input devices, such as physical or virtual switches, or additional proximity sensing regions. Conversely, the capacitive proximity sensor device 11 can be implemented with no additional input devices.

Likewise, the positional information determined the processor 19 can be any suitable indicia of object presence. For example, the processor 19 can be implemented to determine "zero-dimensional" 1-bit positional information (e.g. near/far or contact/no contact) or "one-dimensional" positional information as a scalar (e.g. position or motion along a sensing region). Processor 19 can also be implemented to determine multi-dimensional positional information as a combination of values (e.g. two-dimensional horizontal/vertical axes, three-dimensional horizontal/vertical/depth axes, angular/radial axes, or any other combination of axes that span multiple dimensions), and the like. Processor 19 can also be implemented to determine information about time or history.

Furthermore, the term "positional information" as used herein is intended to broadly encompass absolute and relative position-type information, and also other types of spatial-domain information such as velocity, acceleration, and the like, including measurement of motion in one or more directions. Various forms of positional information may also include time history components, as in the case of gesture recognition and the like. As will be described in greater detail below, the positional information from the processor 19 facilitates a full range of interface inputs, including use of the proximity sensor device as a pointing device for cursor control, scrolling, and other functions.

It should be noted that although the various embodiments described herein are referred to as "capacitive proximity sensor devices", these terms as used herein are intended to encompass not only conventional capacitive proximity sensor devices, but also a broad range of equivalent devices that are capable of capacitively detecting the position of a one or more fingers, pointers, styli and/or other objects. Such devices may include, without limitation, touch screens, touch pads, touch tablets, biometric authentication devices, handwriting or character recognition devices, and the like.

In some embodiments the capacitive proximity sensor device 11 is adapted as part of a touch screen interface. Specifically, the proximity sensor device is combined with a display screen that is overlapped by at least a portion of the sensing region 18. In this embodiment, the proximity sensor device and the display screen together provide a touch screen for interfacing with the electronic system 10. The display screen can be any type of electronic display capable of displaying a visual interface to a user, and can include any type of LED (including organic LED (OLED)), CRT, LCD, plasma, EL or other display technology. When so implemented, the proximity sensor device of touch screen interface can be used activate functions on the electronic system 100, such as by allowing a user to select a function by placing an object in the sensing region proximate an icon or other user interface element that is associated with or otherwise identifies the function. The user's placement of the object can thus identify the function to the electronic system 10. Likewise, the proximity sensor device of touch screen interface can be used to facilitate user interface interactions, such as button functions, scrolling, panning, menu navigation, cursor control, and the like. As another example, the proximity sensor device can be used to facilitate value adjustments, such as by enabling changes to a device parameter. Device parameters can include visual parameters such as color, hue, brightness, and contrast, auditory parameters such as volume, pitch, and intensity, operation parameters such as speed and amplification. In these examples, the proximity sensor device is used to both activate the function and then to perform the adjustment, typically through the use of object motion in the sensing region 18.

The embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit of the forthcoming claims.

What is claimed is:

1. A capacitive proximity sensor device, the capacitive proximity sensor device comprising:
   a sensing electrode, the sensing electrode having an associated measurable capacitance that varies with object proximity;
   a storage capacitor;
   a charging circuit, the charging circuit configured to selectively couple the storage capacitor and to selectively charge the storage capacitor to a predetermined level, thereby storing a set amount of charge on the storage capacitor;
   a charge transfer circuit, the charge transfer circuit configured to controllably transfer charge from the storage capacitor to the sensing electrode while measuring voltage on the sensing electrode and, where the charge transfer circuit is configured to cease controllably transferring charge responsive to the measured voltage on the sensing electrode reaching a defined level, with a residual voltage remaining on the storage capacitor after the transfer; and
   a measurement circuit coupled to the storage capacitor, the measurement circuit configured to measure the residual voltage remaining on the storage capacitor to determine the measurable capacitance associated with the sensing electrode from the measured residual voltage.

2. The proximity sensor device of claim 1 wherein the charge transfer circuit includes a transistor coupled between the sensing electrode and the storage capacitor, the charge transfer circuit configured to bias the transistor to controllably transfer charge from the storage capacitor to the sensing electrode.

3. The proximity sensor device of claim 2 wherein the transistor comprises a field effect transistor, and wherein the charge transfer circuit is configured to bias the field effect transistor in a saturation region to controllably transfer charge from the storage capacitor to the sensing electrode.

4. The proximity sensor device of claim 3 wherein the charge transfer circuit includes an comparator coupled to a gate of the field-effect transistor, the comparator configured to measure voltage on the sensing electrode by comparing the voltage on the sensing electrode with a reference voltage, the comparator configured to operate the transistor in the saturation mode when the voltage on the sensing electrode is less than the reference voltage.

5. The proximity sensor device of claim 1 wherein the measurement circuit is configured to determine the measurable capacitance associated with the sensing electrode from the measured residual voltage by comparing the measured residual voltage to a threshold value.

6. The proximity sensor device of claim 1 wherein the measurement circuit is configured to determine the measurable capacitance associated with the sensing electrode from the measured residual voltage by filtering the measured residual voltage, and performing an analog-to-digital conversion of the filtered residual voltage.

7. The proximity sensor device of claim 1 wherein the measurement circuit is configured to determine the measurable capacitance associated with the sensing electrode from the measured residual voltage by filtering multiple measured residual voltages generated by repeated transfers of charge from the storage capacitor to the sensing electrode, repeatedly sampling the filtered multiple measured residual voltages, and repeatedly performing an analog-to-digital conversion of the sampled filtered multiple measured residual voltages.

8. The proximity sensor device of claim 1 further comprising:
   a second storage capacitor;
   a second charging circuit, the second charging circuit configured to selectively couple the second storage capacitor and to selectively charge the second storage capacitor to a second predetermined level, thereby storing a set amount of charge on the second storage capacitor;
   a second charge transfer circuit, the charge transfer circuit configured to controllably transfer charge from the second storage capacitor to the sensing electrode while measuring voltage on the sensing electrode and, where the second charge transfer circuit is configured to cease controllably transferring charge responsive to the measured voltage on the sensing electrode reaching a second defined level, with a second residual voltage remaining on the second storage capacitor after the transfer; and and wherein the measurement circuit is further coupled to the second storage capacitor, the measurement circuit configured to measure the second residual voltage remaining on the second storage capacitor, and wherein the measurement circuit is further configured to determine the measurable capacitance associated with the sensing electrode from the measured second residual voltage.

9. The proximity sensor device of claim 8 wherein the second storage capacitor is coupled to a first switch and a second switch, the first switch configured to switch a first electrode of the second storage capacitor between ground and the measurement circuit, the second switch configured to switch a second electrode of the second storage capacitor to a reference voltage.

10. The proximity sensor device of claim 9 wherein the measurement circuit includes a multiplexer, and wherein the storage capacitor is coupled to a first input of the multiplexer, and wherein the second storage capacitor is coupled to a second input of the multiplexer.

11. The proximity sensor device of claim 8 wherein the measurement circuit includes a mixer, and wherein the mixer is coupled to the storage capacitor and the second storage capacitor, and is configured to selectively combine the measured residual voltage and the second measured residual voltage.

12. A capacitive proximity sensor device, the capacitive proximity sensor device comprising:
a sensing electrode, the sensing electrode having an associated measurable capacitance that varies with object proximity;
a storage capacitor;
a charging circuit, the charging circuit configured to selectively couple the storage capacitor and to selectively charge the storage capacitor to a predetermined level, thereby storing a set amount of charge on the storage capacitor;
a charge transfer circuit, the charge transfer circuit including a field effect transistor coupled between the sensing electrode and the storage capacitor, the charge transfer circuit further including a comparator coupled to the gate of the field effect transistor, the comparator configured to measure voltage on the sensing electrode by comparing the voltage on the sensing electrode with a reference voltage, the comparator configured to operate the field effect transistor in a saturation mode when the voltage on the sensing electrode is less than the reference voltage such that the charge transfer circuit controllably transfers charge from the storage capacitor to the sensing electrode while the voltage on the sensing electrode is less than the reference voltage, and wherein the comparator is configured to turn off the field effect transistor when the voltage on the sensing electrode is greater than the reference voltage such that the charge transfer circuit ceases controllably transferring charge responsive to the voltage on the sensing electrode reaching the reference voltage, with a residual voltage remaining on the storage capacitor after the transfer; and
a measurement circuit coupled to the storage capacitor, the measurement circuit configured to measure the residual voltage remaining on the storage capacitor to determine the measurable capacitance associated with the sensing electrode from the measured residual voltage.

13. A method for sensing a proximate object, the method comprising the steps of:
charging a storage capacitor to a predetermined level, thereby storing a set amount of charge on the storage capacitor;
controllably transferring charge from the storage capacitor to a sensing electrode having an associated measurable capacitance that varies with object proximity while measuring voltage on the sensing electrode, until the measured voltage on the sensing electrode reaches a defined level, with a residual voltage remaining on the storage capacitor after the transferring; and
measuring the residual voltage remaining on the storage capacitor; and
determining the measurable capacitance associated with the sensing electrode from the measured residual voltage.

14. The method of claim 13 wherein the step of controllably transferring charge from the storage capacitor to a sensing electrode comprises transferring charge through a transistor biased to controllably transfer charge from the storage capacitor to the sensing electrode.

15. The method of claim 14 wherein the transistor comprises a field-effect transistor, and wherein the field-effect transistor is biased in a saturation region to controllably transfer charge from the storage capacitor to the sensing electrode.

16. The method of claim 15 wherein the step of controllably transferring charge from the storage capacitor to a sensing electrode while measuring voltage on the sensing electrode comprises:
comparing the voltage on the sensing electrode with a reference voltage and operating the field-effect transistor in the saturation region when the voltage on the sensing electrode is less than the reference voltage.

17. The method of claim 13 wherein the step of determining a measurable capacitance associated with the sensing electrode from the measured residual voltage comprises:
comparing the measured residual voltage to a threshold value.

18. The method of claim 13 wherein the step of determining a measurable capacitance associated with the sensing electrode from the measured residual voltage comprises:
filtering the measured residual voltage, and performing an analog-to-digital conversion of the filtered residual voltage.

19. The method of claim 13 wherein the step of determining a measurable capacitance associated with the sensing electrode from the measured residual voltage comprises
filtering measured residual voltages generated by repeated transfers of charge from the storage capacitor to the sensing electrode and repeated measuring of residual voltages remaining on the storage capacitor;
repeatedly sampling the filtered measured residual voltages; and
repeatedly performing an analog-to-digital conversion of the sampled filtered multiple measured residual voltages.

20. A capacitive proximity sensor device, the capacitive proximity sensor device comprising:
a plurality of sensing electrodes, the plurality of sensing electrodes each having an associated measurable capacitance that varies with object proximity;
a plurality of storage capacitors;
a charging circuit, the charging circuit configured to selectively couple the storage capacitor and to selectively charge the plurality of storage capacitors to a predetermined level, thereby storing a set amount of charge on each of the plurality of storage capacitors;

a charge transfer circuit, the charge transfer circuit configured to controllably transfer charge from each of the plurality of storage capacitors to an associated sensing electrode in the plurality of sensing electrodes while measuring voltage on the associated sensing electrode and, where the charge transfer circuit is configured to cease controllably transferring charge responsive to the measured voltage on the associated sensing electrode reaching a defined level, with a residual voltage remaining on each storage capacitor after the transfer; and a measurement circuit coupled to the plurality of storage capacitors, the measurement circuit configured to measure the residual voltages remaining on each of the plurality of storage capacitors to determine the measurable capacitance associated with each of the plurality of sensing electrodes from the measured residual voltages, and wherein the measured residual voltages are used by the sensor device to determine positional information regarding an object proximate the plurality of sensing electrodes.

21. The proximity sensor device of claim 20 wherein the charge transfer circuit includes a plurality of transistors, each of the plurality of transistors coupled between a storage capacitor in the plurality of storage capacitors and its associated sensing electrode, the charge transfer circuit configured to bias each transistor to controllably transfer charge from each storage capacitor to its associated sensing electrode.

22. The proximity sensor device of claim 21 wherein the plurality of transistors comprise field effect transistors, and wherein the charge transfer circuit is configured to bias the field effect transistors in a saturation region to controllably transfer charge from the each storage capacitor to its associated sensing electrode.

* * * * *